United States Patent
Liu (10) Patent No.: US 9,936,270 B2
(45) Date of Patent: Apr. 3, 2018

(54) POWER-SAVING COMMUNICATION SYSTEM HAVING LEAKY TRANSMISSION LINES AND AMPLIFIERS TO EXTEND WIRELESS COVERAGE AND POWER CONTROL UNIT INCLUDED THEREIN

(71) Applicant: Telefonaktiebolaget L M Ericsson (publ), Stockholm (SE)

(72) Inventor: Yang Liu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 194 days.

(21) Appl. No.: 14/785,021

(22) PCT Filed: Apr. 19, 2013

(86) PCT No.: PCT/CN2013/074410
§ 371 (c)(1),
(2) Date: Oct. 16, 2015

(87) PCT Pub. No.: WO2014/169474
PCT Pub. Date: Oct. 23, 2014

(65) Prior Publication Data
US 2016/0066069 A1    Mar. 3, 2016

(51) Int. Cl.
*G08C 19/04*    (2006.01)
*H04Q 9/00*    (2006.01)
(Continued)

(52) U.S. Cl.
CPC ............... *H04Q 9/00* (2013.01); *H01P 1/24* (2013.01); *H01Q 1/3225* (2013.01);
(Continued)

(58) Field of Classification Search
CPC .... H04Q 9/00; H04Q 2209/883; H01Q 13/20; H01Q 1/3225; H01Q 13/206;
(Continued)

(56) References Cited

U.S. PATENT DOCUMENTS

| 4,006,315 A * | 2/1977 | Halstead ............... H01P 3/06 |
| | | 455/41.1 |
| 5,018,165 A | 5/1991 | Sohner et al. |
| 2015/0171510 A1* | 6/2015 | Hirose ............ H01Q 1/3241 |
| | | 343/713 |

FOREIGN PATENT DOCUMENTS

| CN | 101172547 A | 5/2008 |
| JP | 2003054411 A | 2/2003 |
| JP | 2004236165 A | 8/2004 |

\* cited by examiner

*Primary Examiner* — Ryan Sherwin
(74) *Attorney, Agent, or Firm* — Coats & Bennett, PLLC (57) ABSTRACT

The present disclosure discloses a communication system and a power control unit included therein. The communication system comprises a signal source, one or more amplifiers, one or more terminators and leaky transmission lines. The signal source is configured to provide communication signals. The one or more amplifiers are configured to amplify incoming communication signals. The one or more terminators configured to terminate communication signals. The leaky transmission lines are disposed in correspondence with sections of a elongated area and connect the signal source to each of the one or more terminators via at least one of the amplifiers. The communication system further comprises sensors and the power control unit. Each of the sensors is positioned in correspondence with one of the amplifiers and the terminators and configured to sense whether a vehicle approaches said one of the amplifiers and the terminators. The power control unit is configured to receive sensing results from the sensors and to control each of the amplifiers to amplify its incoming communication signals to a normal power level $P_{normal}$ or a power level lower than $P_{normal}$ based on the received sensing results.

14 Claims, 5 Drawing Sheets

(51) Int. Cl.
    *H01Q 1/32*           (2006.01)
    *H01Q 13/20*         (2006.01)
    *H01P 1/24*           (2006.01)
    *H03G 3/20*          (2006.01)
    *H04W 16/18*        (2009.01)
    *H04W 52/02*        (2009.01)

(52) U.S. Cl.
    CPC ............ *H01Q 13/20* (2013.01); *H01Q 13/206*
        (2013.01); *H03G 3/20* (2013.01); *H04W 16/18*
        (2013.01); *H04W 52/0203* (2013.01); *H04Q*
        *2209/883* (2013.01); *Y02B 60/50* (2013.01)

(58) Field of Classification Search
    CPC .... H04W 52/0203; H04W 16/18; H03G 3/20;
                                            H01P 1/24
    See application file for complete search history.

POWER-SAVING COMMUNICATION SYSTEM HAVING LEAKY TRANSMISSION LINES AND AMPLIFIERS TO EXTEND WIRELESS COVERAGE AND POWER CONTROL UNIT INCLUDED THEREIN

TECHNICAL FIELD

The present disclosure generally relates to the technical field of wireless communication systems, and particularly, to a power-saving communication system having leaky transmission lines and amplifiers to extend wireless coverage and a power control unit included therein.

BACKGROUND

This section is intended to provide a background to the various embodiments of the technology described in this disclosure. The description in this section may include concepts that could be pursued, but are not necessarily ones that have been previously conceived or pursued. Therefore, unless otherwise indicated herein, what is described in this section is not prior art to the description and/or claims of this disclosure and is not admitted to be prior art by the mere inclusion in this section.

In order for wireless systems to provide wireless coverage for elongated areas in a cost-effective manner, leaky transmission lines such as leaky coaxial cables have been proposed and widely deployed as a supplement to the basic wireless network infrastructure.

In contrast with an ordinary transmission line whose outer conductor is specially designed for minimizing electromagnetic radiation, a leaky transmission line has openings deliberately arranged on its outer conductor. Via these openings, electromagnetic waves may leak out of the leaky transmission line to provide wireless coverage for an elongated area along the leaky transmission line.

As elongated areas in the real world (such as expressways, railways and tunnels, etc.) are typically much longer than any single leaky transmission line and signals undergo significant attenuation while travelling along leaky transmission lines, amplifiers are often used with leaky transmission lines to construct a transmission network covering an entire elongated area.

Two typical topologies of networks consisted of leaky transmission lines and amplifiers are respectively illustrated in FIGS. 1-2 and will be described in the following.

Figure 1:
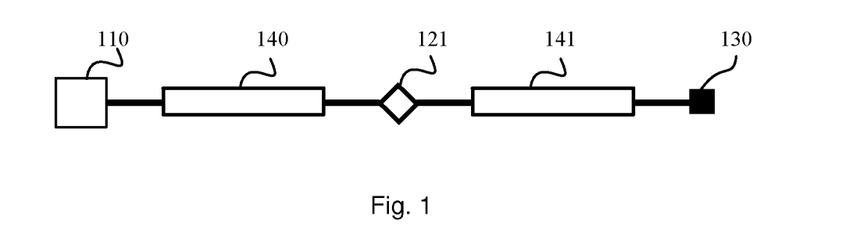
FIG. 1 is a diagram schematically illustrating a cascade structure of a network consisted of leaky transmission lines and amplifiers.

Referring to FIG. 1, a so-called cascade structure is illustrated, which includes a signal source 110, two leaky transmission lines 140 and 141 coupled via a amplifier 121 and a terminator 130. The signal source 110 provides communication signals compliant with any known or heretofore unknown wireless networks and couples the communication signals into the leaky transmission line 140 in a wired manner. After transmitted through the leaky transmission line 140, the communication signals are amplified at the amplifier 120 and then fed into the leaky transmission line 141. After transmitted through the leaky transmission line 141, the communication signals are terminated at the terminator 130.

As a straightforward extension of the cascade structure illustrated in FIG. 1, a cascade of three or more leaky transmission lines can be formed to connect the signal source 110 to the terminator 130, with more than one amplifiers concatenated therebetween. To prevent the quality of transmitted communication signals from being significantly deteriorated by noise accumulation and nonlinear product due to concatenation of too many amplifiers, the number of concatenated amplifiers is normally limited to be less than 3.

Figure 2:
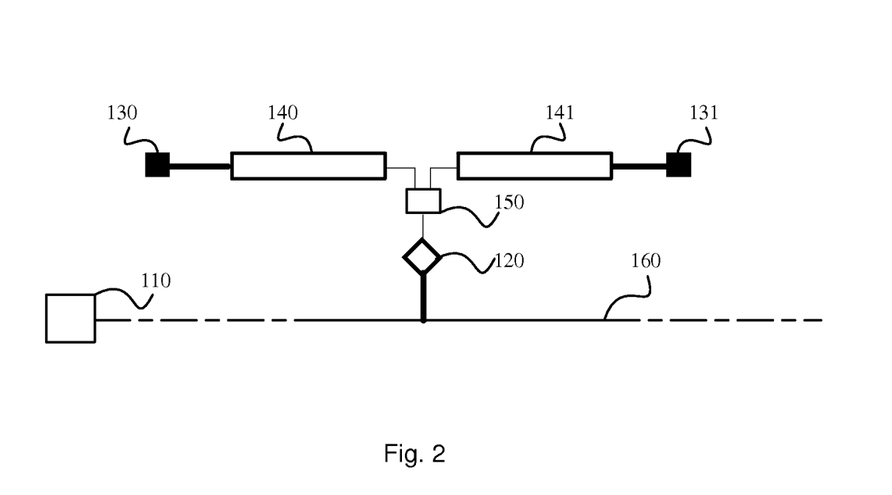
FIG. 2 is a diagram schematically illustrating a T structure of a network consisted of leaky transmission lines and amplifiers.

FIG. 2 illustrates a so-called T structure, which includes a signal source 110, an amplifier 120, two terminals 130 and 131, two leaky transmission lines 140 and 141, a divider 150 and a long distance transmission line 160. The signal source 110 supplies communication signals onto the long distance transmission line 160. The amplifier 120 receives and amplifies the communication signals carried on the long distance transmission line 160, and supplies the amplified communication signals into both of the leaky transmission lines 140 and 141 via the divider 150. After transmitted through the leaky transmission lines 140 and 141, the amplified communication signals are terminated at the terminators 130 and 131, respectively.

By using an optical fiber as the long distance transmission line 160 and including the amplifier 120 in an optical repeater, the T structure as shown in FIG. 2 is suitable to be used in connection with optical fiber distribution systems.

In practical implementations, the cascade structure and the T structure can be combined as needed to form more complex topologies. One example of combinations of the cascade structure and the T structure is presented in FIG. 3. As illustrated, a signal source 110, a long distance transmission line 160, an amplifier 120, a divider 150 and two leaky transmission lines 141 and 142 constitute a T structure. From the leaky transmission line 141, a cascade structure consisted of an amplifier 121, a leaky transmission line 140 and a terminator 130 is extended as one branch of the T structure. From the leaky transmission line 142, a cascade structure comprising the leaky transmission line 142, at least one amplifier 122, at least one leaky transmission line 143 and a terminator 131 is extended as the other branch of the T structure.

In existing communication systems having leaky transmission lines and amplifiers to extend wireless coverage, every amplifier is configured to always amplify its incoming communication signals to a normal power level $P_{normal}$, so that electromagnetic waves leaked from leaky transmission lines disposed in correspondence with sections of an elongated area are strong enough to provide constant wireless coverage for the entire area. As such, whenever a vehicle (such as an automobile, a train, etc.) carrying a user equipment (UE) travels along whichever section of the area, the UE can be provided with wireless service having a satisfactory quality of service (QoS).

Sometimes, however, there may be no vehicle present in some or all sections of the area. In this scenario, it is a waste of power to keep all amplifiers amplifying their incoming communication signals to a normal power level $P_{normal}$ and thus provide constant wireless coverage for the entire area.

SUMMARY

In view of the foregoing, there is needed a technique for reducing power consumption in communication systems having leaky transmission lines and amplifiers to extend wireless coverage.

According to a first aspect of the disclosure, there is provided a communication system comprising a signal source, one or more amplifiers, one or more terminators and leaky transmission lines. The signal source is configured to provide communication signals. The one or more amplifiers are configured to amplify incoming communication signals. The one or more terminators configured to terminate communication signals. The leaky transmission lines are disposed in correspondence with sections of a elongated area and connect the signal source to each of the one or more terminators via at least one of the amplifiers. The communication system further comprises sensors and the power control unit. Each of the sensors is positioned in correspondence with one of the amplifiers and the terminators and configured to sense whether a vehicle approaches said one of the amplifiers and the terminators. The power control unit is configured to receive sensing results from the sensors and to control each of the amplifiers to amplify its incoming communication signals to a normal power level $P_{normal}$ or a power level lower than $P_{normal}$ based on the received sensing results.

According to a second aspect of the disclosure, there is provided the power control unit in the communication system described above.

As certain amplifiers may be controlled to amplify their incoming communication signals to a power level lower than $P_{normal}$ based on sensing results from sensors, it is possible to reduce power consumption in communication systems having leaky transmission lines and amplifiers to extend wireless coverage.

BRIEF DESCRIPTION OF THE DRAWINGS

The above and other objects, features, and advantages of the present disclosure will become apparent from the following descriptions on embodiments of the present disclosure with reference to the drawings, in which.

DETAILED DESCRIPTION OF EMBODIMENTS

Hereinafter, the present disclosure is described with reference to embodiments shown in the attached drawings. However, it is to be understood that those descriptions are just provided for illustrative purpose, rather than limiting the present disclosure. Like reference numerals are used throughout the description and several views of the drawings to indicate like or corresponding parts to the extent feasible.

Figure 4:
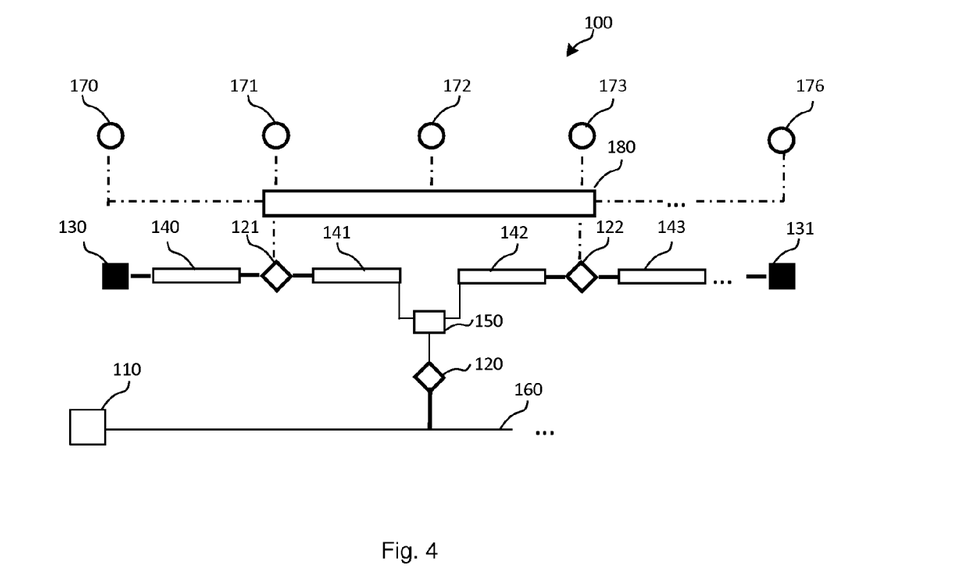
FIG. 4 is a diagram schematically illustrating an example of a power-saving communication system having leaky transmission lines and amplifiers to extend wireless coverage according to the present disclosure.

FIG. 4 illustrates an example of a power-saving communication system having leaky transmission lines and amplifiers to extend wireless coverage according to the present disclosure.

Figure 3:
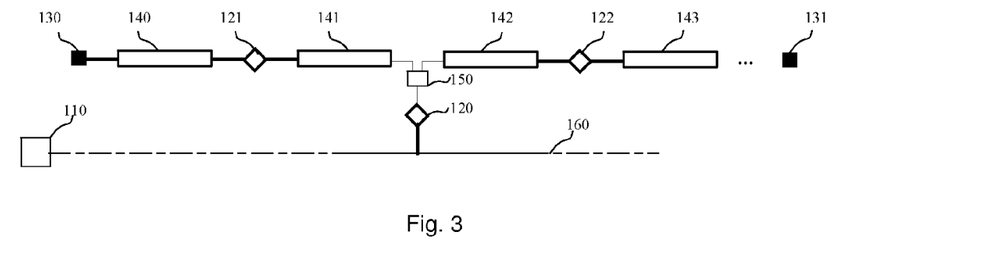
FIG. 3 is a diagram schematically illustrating a combination of the cascade structure and the T structure.

As compared with the existing communication system shown in FIG. 3, the proposed power-saving communication system 100 shown in FIG. 4 additionally comprises sensors 170-176 and a power control unit 180.

Each of the sensors 170-176 is positioned in correspondence with one of the amplifiers 120-122 and terminators 130-131, and is configured to sense whether a vehicle approaches the corresponding one of the amplifiers and the terminators.

The sensors may comprise at least one of an acoustic sensor, a visual sensor, a pressure sensor or a vibration sensor. If the proposed power-saving communication system is to be used to provide extended wireless coverage for a road along which cameras have been mounted for traffic monitoring, the cameras for traffic monitoring may be reused as sensors of the proposed power-saving communication system.

The power control unit 180 is configured to receive sensing results from the sensors 170-176 and to control each of the amplifiers 120-122 to amplify its incoming communication signals to a normal power level $P_{normal}$ or a power level lower than $P_{normal}$ based on the received sensing results.

In a case where an amplifier is controlled to amplify its incoming communication signals to $P_{normal}$, the amplified communication signals can be recovered after transmission through one or more leaky transmission lines receiving the signals, and electromagnetic waves leaked from the one or more leaky transmission lines are strong enough to provide wireless coverage for sections of an elongated area corresponding to the one or more leaky transmission lines.

In one embodiment, the power control unit 180 may comprises a receiving subunit to receive sensing results from the sensors 170-176 and a controlling subunit to control each of the amplifiers 120-122 to amplify its incoming communication signals based on the received sensing results.

With the configuration described above, the power control unit 180 may control some of the amplifiers 120-122 to amplify their incoming communication signals to a power level lower than $P_{normal}$ based on sensing results from sensors 170-176. Accordingly, it is possible to reduce power consumption in the communication system 100 having leaky transmission lines and amplifiers to extend wireless coverage.

In the following, several specific embodiments will be given to illustrate how a power control unit may control amplification of amplifiers based on sensing results received from sensors for saving power.

Figure 5:
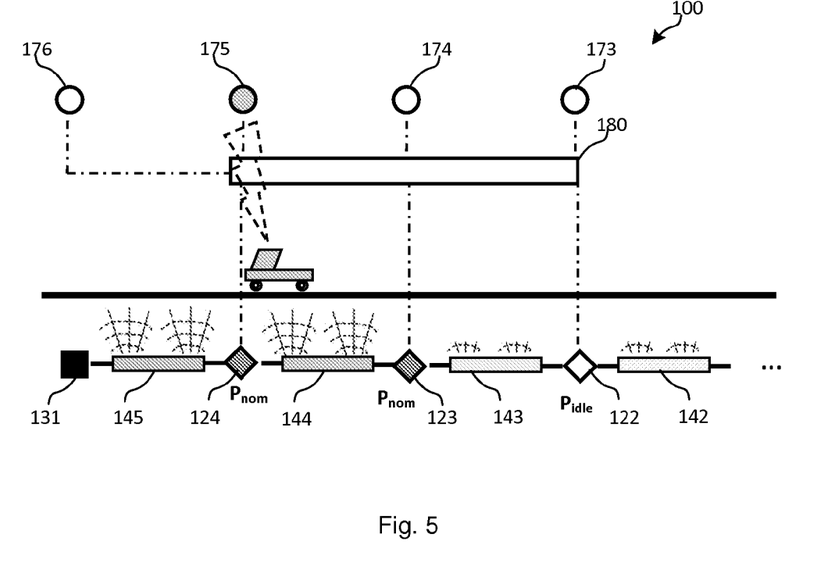
FIG. 5 is a diagram schematically illustrating how to control amplifiers to amplify their incoming communication signals based on sensing results from sensors according to an embodiment of the present disclosure.

Referring firstly to FIG. 5, the communication system 100 arranged to provide extended wireless coverage for a road includes amplifiers 122-124 concatenated via leaky transmission lines 143 and 144, and the only vehicle traveling along the road is near the amplifier 124.

In this scenario, sensors 173 and 174 may sense that no vehicle approaches their corresponding amplifiers 122 and 123 for a period of time. Receiving these sensing results, the power control unit 180 may control the amplifier 122 to amplify its incoming communication signals to a power level $P_{idle}$ less than $P_{normal}$, so that the amplified communication signals can be recovered after transmission from the amplifier 122 to its succeeding amplifier 123 through the leaky transmission line 143 while electromagnetic waves leaked from the leaky transmission line 143 are not strong enough to provide wireless coverage for a section of road corresponding to the leaky transmission line 143.

In this manner, power consumption in the system 100 can be reduced as compared with existing systems where all amplifiers constantly amplify their incoming communication signals to $P_{normal}$.

In the scenario shown in FIG. 5, the sensor 175 may sense that a vehicle approaches the amplifier 124. Receiving this sensing result, the power control unit 180 may control the amplifiers 124 and 123 to amplify their incoming communication signals to $P_{normal}$, so that the amplified communication signals can be recovered after transmission through leaky transmission lines 144 and 145, and electromagnetic waves leaked from the leaky transmission lines 144 and 145 are strong enough to provide wireless coverage for sections of road corresponding to the leaky transmission lines 144 and 145.

As such, no matter which direction the vehicle will move along later, it can be provided with wireless service having a satisfactory QoS.

To ensure that no vehicle runs on the section of road corresponding to the leaky transmission line 143 when the amplifier 122 is controlled to reduce its amplified communication signals, the amplifier 122 might be controlled to reduce its amplified communication signals if the power control unit 170 receives sensing results from the sensor 173 indicating that no vehicle approaches the amplifier 122 for a predetermined time which is long than the expected time the vehicle takes to travel from the amplifier 122 to the amplifier 123.

Figure 6:
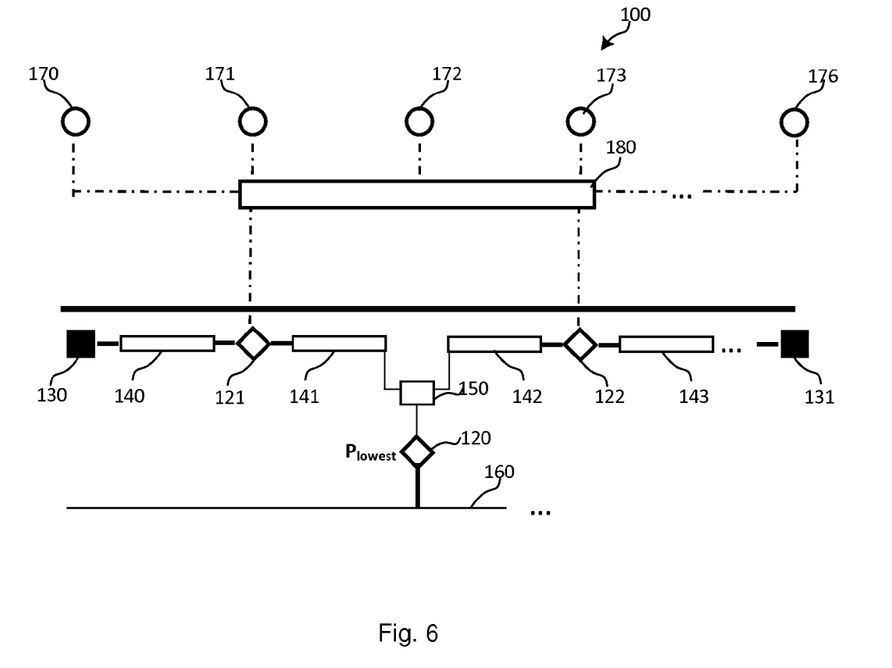
FIG. 6 is a diagram schematically illustrating how to control amplifiers to amplify their incoming communication signals based on sensing results from sensors according to an embodiment of the present disclosure.

Referring now to FIG. 6, the communication system 100 arranged to provide extended wireless coverage for a road includes a T structure consisted of an amplifier 120, a divider 150 and two leaky transmission lines 141 and 142. One branch of the T structure extending from the leaky transmission line 141 further includes an amplifier 121, a leaky transmission line 140 and a terminator 130. The other branch of the T structure further includes at least one amplifier 122, at least one leaky transmission line 143 and a terminator 131. No vehicle is traveling along the road.

In this scenario, sensors 170-176 may sense that no vehicle approaches their corresponding terminators 130, 131 and amplifiers 120-122 for a period of time. Receiving these sensing results, the power control unit 180 may control the amplifier 120 as the trunk of the T structure not to amplify its incoming communication signals or to amplify its incoming communication signals to a power level $P_{lowest}$ less than $P_{normal}$, so that the amplified communication signals cannot be recovered after transmission from the amplifier 120 through leaky transmission lines 141, 142 receiving the signals and electromagnetic waves leaked from the leaky transmission lines 141, 142 are not strong enough to provide wireless coverage for sections of road corresponding to the leaky transmission lines 141, 142.

In a case where the power control unit 180 receives sensing results from one of sensors 170-176 corresponding to all terminators 130, 131 and amplifiers 120-122 of the T structure indicating that a vehicle approaches one of the terminators 130, 131 and amplifiers 120-122, the power control unit 180 may control the amplifier 120 to amplify its incoming communication signals to $P_{normal}$ or $P_{idle}$.

Figure 7:
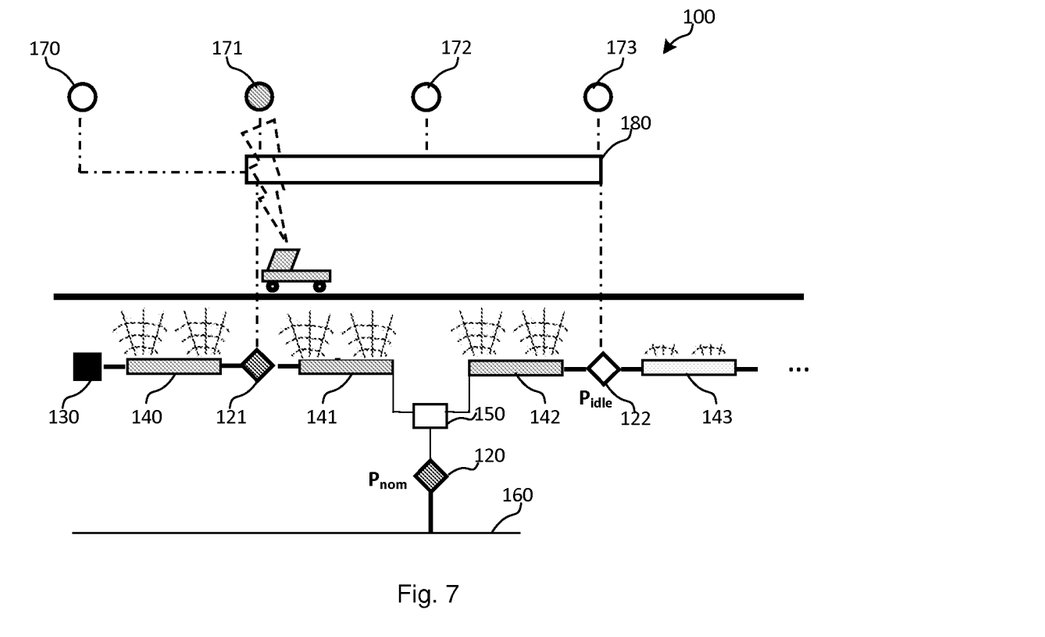
FIG. 7 is a diagram schematically illustrating how to control amplifiers to amplify their incoming communication signals based on sensing results from sensors according to an embodiment of the present disclosure.

Specifically, in a scenario shown in FIG. 7, the power control unit 180 merely receives sensing results from the sensor 171 indicating that a vehicle approaches the amplifier 121. At this point, the power control 180 may control the amplifier 120 to amplify its incoming communication signals to $P_{normal}$ and meanwhile control the amplifier 121 to amplify its incoming communication signals to $P_{normal}$. As such, no matter which direction the vehicle will move along later, it can be provided with wireless service having a satisfactory QoS.

In a scenario where the power unit 180 merely receives sensing results from the sensor 170 indicating that a vehicle approaches the terminator 130, the power unit 180 may control the amplifier 120 to amplify its incoming communication signals to $P_{idle}$.

Since the amplifier 120 as the trunk of the T structure may be controlled to amplify its incoming communication signals to a power level lower than $P_{normal}$, power consumption in the system 100 can be reduced as compared with existing systems where all amplifiers constantly amplify their incoming communication signals to $P_{normal}$.

Figure 8:
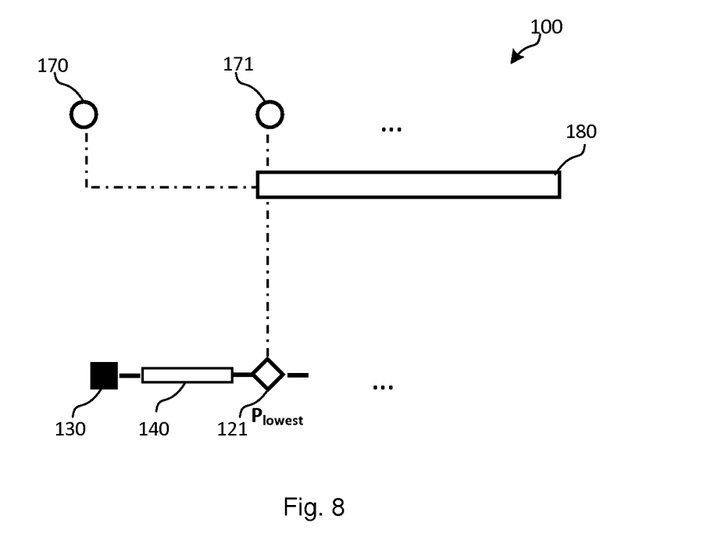
FIG. 8 is a diagram schematically illustrating how to control amplifiers to amplify their incoming communication signals based on sensing results from sensors according to an embodiment of the present disclosure.

FIG. 8 illustrates a scenario where the sensors 170 and 171 sense that no vehicle approaches their corresponding terminator 130 and amplifier 121 for a predetermined time and the amplifier 121 does not constitute a trunk of a T structure. In this case, the power control unit 180 may control the amplifier 121 not to amplify its incoming communication signals or to amplify its incoming communication signals to a power level $P_{lowest}$ less than $P_{normal}$, so that the amplified communication signals cannot be recovered after transmission from the amplifier 121 to the terminator 130 through the leaky transmission line 140 therebetween and electromagnetic waves leaked from the leaky transmission line 140 are not strong enough to provide wireless coverage for a section of the elongated area corresponding to the leaky transmission line 140.

Figure 9:
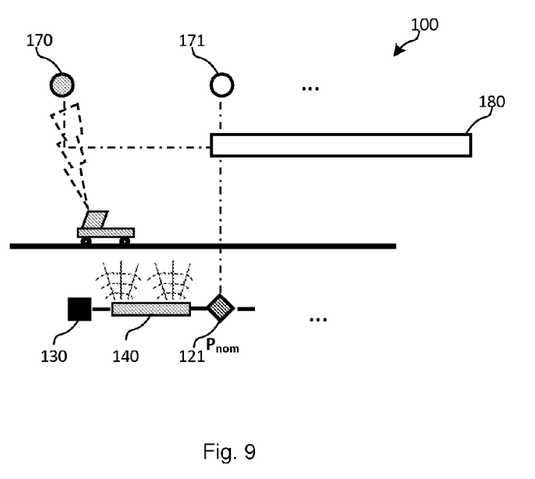
FIG. 9 is a diagram schematically illustrating how to control amplifiers to amplify their incoming communication signals based on sensing results from sensors according to an embodiment of the present disclosure.

In a scenario where the sensor 170 senses that a vehicle approaches the terminator 130 and the amplifier 121 does not constitute a trunk of a T structure as shown in FIG. 9, the power control unit 180 may control the amplifier 121 to amplify its incoming communication signals to $P_{normal}$.

Figure 10:
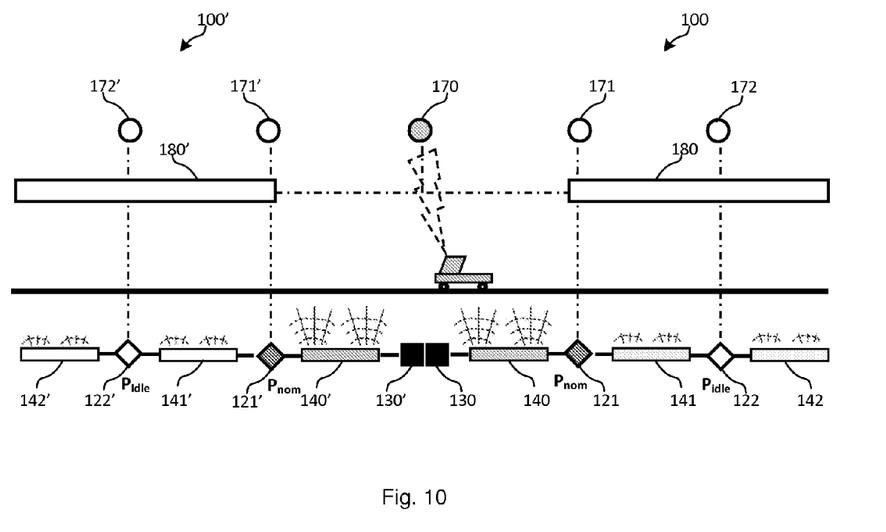
FIG. 10 is a diagram schematically illustrating how to combine a plurality of the proposed communication systems.

FIG. 10 illustrates how to combine a plurality of the proposed communication systems to provide a seamless wireless coverage and power control. As shown in the figure, one terminator 130 in the communication system 100 and one terminator 130' from another communication system 100' are co-located and share the same sensor 170. As such, when the sensor 170 senses that a vehicle approaches the terminators 130 and 130', both power control units 180 and 180' receiving the sensing result may control amplifiers 121 and 121' to amplify their incoming communication signals to $P_{normal}$.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:
1. A communication system, comprising:
a signal source configured to provide communication signals;
one or more amplifiers configured to amplify incoming communication signals;

one or more terminators configured to terminate communication signals;

leaky transmission lines disposed in correspondence with sections of an elongated area and connecting the signal source to each of the one or more terminators via at least one of the one or more amplifiers;

sensors each positioned in correspondence with one of the one or more amplifiers and the one or more terminators and configured to sense whether a vehicle approaches the one of the one or more amplifiers and the one or more terminators; and a power controller circuit configured to receive sensing results from the sensors and to control each of the one or more amplifiers to amplify its incoming communication signals to a normal power level ($P_{normal}$) or a power level lower than $P_{normal}$ based on the received sensing results.

2. The communication system of claim 1, wherein, when an amplifier is controlled to amplify its incoming communication signals to $P_{normal}$;

the amplified communication signals can be recovered after transmission through one or more of the leaky transmission lines receiving the amplified communication signals, and electromagnetic waves leaked from the one or more of the leaky transmission lines are strong enough to provide wireless coverage for sections of the elongated area corresponding to the one or more of the leaky transmission lines.

3. The communication system of claim 1, wherein at least two amplifiers are concatenated via one or more leaky transmission lines.

4. The communication system of claim 3, wherein, in response to the power controller circuit receiving sensing results from sensors corresponding to one amplifier among the concatenated amplifiers and its succeeding amplifier indicating that no vehicle approaches either of the amplifiers for a predetermined time, the power controller circuit controls the one amplifier to amplify its incoming communication signals to a power level $P_{idle}$ less than $P_{normal}$, so that the amplified communication signals can be recovered after transmission from the one amplifier to its succeeding amplifier through a leaky transmission line therebetween while electromagnetic waves leaked from the leaky transmission line are not strong enough to provide wireless coverage for a section of the elongated area corresponding to the leaky transmission line.

5. The communication system of claim 3, wherein, in response to the power controller circuit receiving sensing results from a sensor corresponding to one amplifier among the concatenated amplifiers indicating that a vehicle approaches the one amplifier, the power controller circuit controls the one amplifier and its preceding amplifier to amplify their incoming communication signals to $P_{normal}$.

6. The communication system of claim 1, wherein at least one of the one or more amplifiers has its amplified communication signals supplied into two leaky transmission lines via a divider, the at least one amplifier constituting a trunk of a T structure and two branches of the T structure extending respectively from the two leaky transmission lines.

7. The communication system of claim 6, wherein at least one of the branches of the T structure contains one or more amplifiers.

8. The communication system of claim 6, wherein, in response to the power controller circuit receiving sensing results from the sensors corresponding to all of the one or more terminators and the one or more amplifiers of the T structure indicating that no vehicle approaches any of the one or more terminators and the one or more amplifiers for a predetermined time, the power controller circuit controls the at least one amplifier that constitutes the trunk of the T structure not to amplify its incoming communication signals or to amplify its incoming communication signals to a power level $P_{lowest}$, which is less than $P_{normal}$, so that the amplified communication signals cannot be recovered after transmission from the at least one amplifier that constitutes the trunk of the T structure through leaky transmission lines receiving the signals and electromagnetic waves leaked from the leaky transmission lines are not strong enough to provide wireless coverage for sections of the elongated area corresponding to the leaky transmission lines.

9. The communication system of claim 6, wherein, in response to the power controller circuit receiving sensing results from one of the sensors corresponding to all of the one or more terminators and the one or more amplifiers of the T structure indicating that a vehicle approaches one of the one or more terminators and one or more amplifiers, the power controller circuit controls the at least one amplifier that constitutes the trunk of the T structure to amplify its incoming communication signals to $P_{normal}$ or $P_{idle}$.

10. The communication system of claim 1, wherein, in response to the power controller circuit receiving sensing results from sensors corresponding to a terminator and an amplifier concatenated with the terminator indicating that no vehicle approaches either of the terminator and the amplifier for a predetermined time, wherein the amplifier does not constitute a trunk of a T structure, the power controller circuit controls the amplifier not to amplify its incoming communication signals or to amplify its incoming communication signals to a power level $P_{lowest}$, which is less than $P_{normal}$, so that the amplified communication signals cannot be recovered after transmission from the amplifier to the terminator through a leaky transmission line therebetween and electromagnetic waves leaked from the leaky transmission line are not strong enough to provide wireless coverage for a section of the elongated area corresponding to the leaky transmission line.

11. The communication system of claim 1, wherein, in response to the power controller circuit receiving sensing results from a sensor corresponding to a terminator indicating that a vehicle approaches the terminator, wherein the terminator is concatenated with an amplifier which does not constitute a trunk of a T structure, the power controller circuit controls the amplifier to amplify its incoming communication signals to $P_{normal}$.

12. The communication system of claim 1, wherein one terminator in the communication system and one terminator from another communication system are co-located and share the same sensor for sensing whether a vehicle approaches the two terminators.

13. The communication system of claim 1, wherein the sensors comprise at least one of:
an acoustic sensor;
a visual sensor;
a pressure sensor; and
a vibration sensor.

14. A power controller circuit in a communication system, the communication system having a signal source configured to provide communication signals; one or more amplifiers configured to amplify incoming communication signals; one or more terminators configured to terminate communication signals; leaky transmission lines disposed in correspondence with sections of an elongated area and connecting the signal source to each of the one or more terminators via at least one of the one or more amplifiers; and sensors each positioned in correspondence with one of the one or more amplifiers and the one or more terminators and configured to sense whether a vehicle approaches the one of the one or more amplifiers and the one or more terminators; the power controller circuit comprising:

one or more processing circuits configured to receive sensing results from the sensors and to control each of the one or more amplifiers to amplify its incoming communication signals to a normal power level ($P_{normal}$) or a power level lower than $P_{normal}$ based on the received sensing results.

* * * * *